(12) United States Patent
Wu et al.

(10) Patent No.: US 6,743,717 B1
(45) Date of Patent: Jun. 1, 2004

(54) METHOD FOR FORMING SILICIDE AT SOURCE AND DRAIN

(75) Inventors: Kuo-Chien Wu, Miaoli (TW); Jeng-Ping Lin, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/397,627

(22) Filed: Mar. 26, 2003

(30) Foreign Application Priority Data

Nov. 29, 2002 (TW) .......................... 91134813 A

(51) Int. Cl.$^7$ .............................................. H01L 21/44
(52) U.S. Cl. ...................... 438/655; 438/649; 438/682
(58) Field of Search ................................ 438/648, 649, 438/650, 651, 655, 664, 682, 683, 685, 762

(56) References Cited

U.S. PATENT DOCUMENTS 6,025,267 A * 2/2000 Pey et al. .................... 438/656

* cited by examiner

*Primary Examiner*—Kevin M. Picardat
(74) *Attorney, Agent, or Firm*—Quintero Law Office

(57) ABSTRACT

A method for forming silicide at source and drain. The method includes providing a semiconductor substrate having an active region and peripheral region, wherein gates with source and drain on two sides are formed in the peripheral region, conformally forming a barrier layer to cover the active region and the peripheral region, forming a mask layer to cover the barrier layer at the active region, removing the barrier layer from the peripheral region; removing the mask layer, forming a metal layer to cover the peripheral region, and subjecting the metal layer to thermal process such that silicon reacts with the metal to form silicide at the source and the drain.

20 Claims, 3 Drawing Sheets

METHOD FOR FORMING SILICIDE AT SOURCE AND DRAIN

BACKGROUND OF THE INVENTION

1. Field of the Invention

The present invention relates to a method for forming silicide, and in particular to a method that forms silicide at source and drain using the barrier layer to conceal areas where silicide is not required.

2. Description of the Related Art

FIG. 1 illustrates a current process for fabricating integrated circuits. Firstly, a plurality of gates 12C and 12S are formed respectively on the cell region and peripheral region of a semiconductor substrate 10. Then, spacers 14 of dielectric material are formed on two sides of the gates 12C and 12S. Next, ion implantation is carried out to form source S and drain D on two sides of the gate 12C at the cell region (C) and on two sides of the gate 12S in the peripheral region (S). A barrier layer 16, usually SiN, is then formed conformally to cover the gates 12C and 12S, followed by formation of an interlayer dielectric (ILD) layer 18.

Due to the ongoing reduction of the sizes of integrated circuits (ICs), the contact resistance and sheet resistance at the source/drain and gates have brought more and more apparent adverse effects to the performance of semiconductor elements. In order to effectively reduce contact resistance and sheet resistance to avoid reduction of saturate current caused by excess contact resistance and sheet resistance, there has been a method proposed to form silicide only in areas that require them so that sheet resistance is reduced. This method starts with the formation of an oxide layer to cover gates. A mask layer is then formed to cover the region not requiring silicide, followed by etching to expose the area that does. This method is advantageous in reducing sheet resistance.

However, the above method requires the formation of another oxide layer, and the deposition of the oxide easily causes problems in filling the cell region. As a result, there is a need for a method able to reduce both sheet resistance and contact resistance without the conventional shortcomings.

SUMMARY OF THE INVENTION

Accordingly, an object of the invention is to provide a method for forming silicide at source and drain using the current barrier layer with the addition of a mask layer, followed by photolithography and etching to protect the area not requiring silicide, thus forming silicide at source and drain. Both sheet resistance and contact resistance are thereby reduced.

The method to form silicide at source and drain provided in the present invention comprises providing a semiconductor substrate having an active region and peripheral region, wherein gates with source and drain on the sides are formed in the peripheral region, conformally forming a barrier layer to cover the active region and the peripheral region, forming a mask layer to cover the barrier layer at the active region, removing the barrier layer covering the peripheral region; removing the mask layer; forming a metal layer to cover the peripheral region, and subjecting the metal layer to thermal process so that silicon reacts with the metal to form silicide at the source and the drain.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
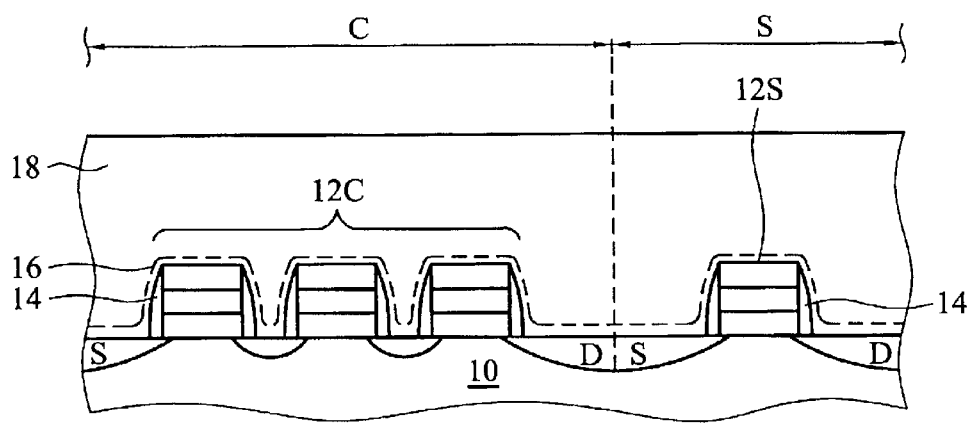
FIG. 1 is cross section of a conventional semiconductor element having memory cell region and peripheral region.
Figure 2A:
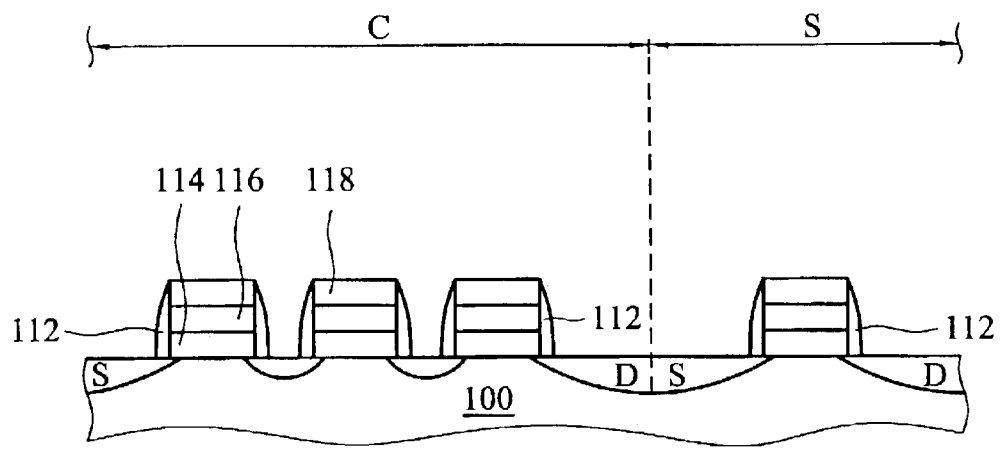
FIGS. 2A–2D are schematic views showing the process according to the method for forming silicide at source and drain of the invention.
Figure 2B:
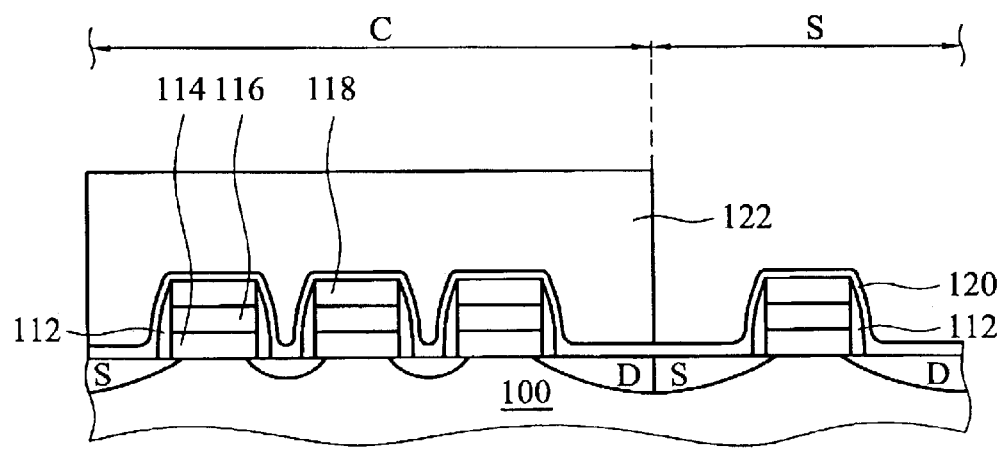
Figure 2C:
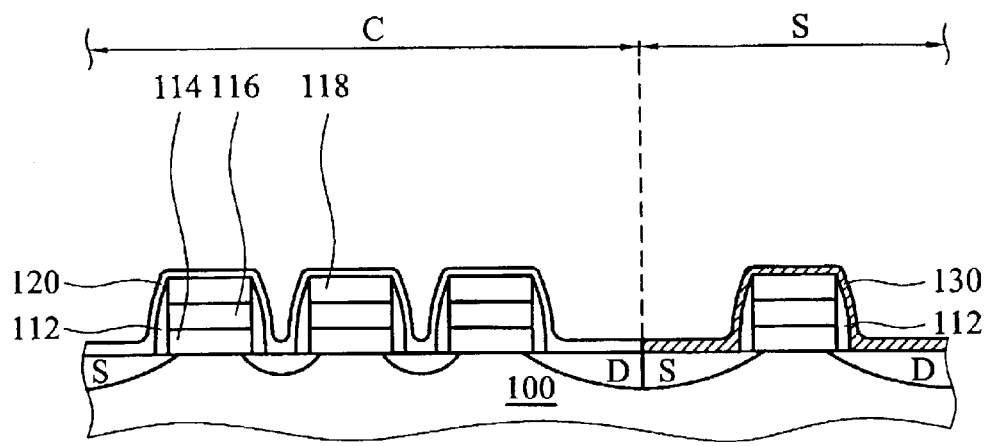
Figure 2D:
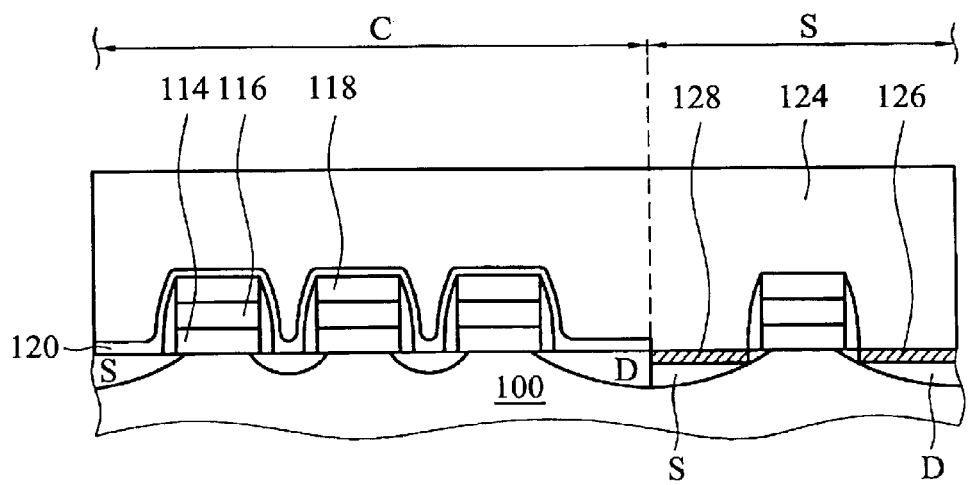

FIGS. 2A–2C schematically show the process according to the method for forming silicide at source and drain of the invention.

First, a semiconductor 100 is provided, followed by the formation of a plurality of gates at the memory cell region (C) and a gate in the peripheral region (S). In this example, only one gate is illustrated in the peripheral region, but the number of gates is not restricted. Next, insulation material forms an insulation layer having a thickness of 200~2000 Å to conformally cover the gates. The insulation material is preferably silicon oxide or silicon nitride. Then, anisotropic etching, such as reactive ion etching (RIE) is carried out to remove the insulation layer located on top of the gates and the semiconductor substrate to form spacers 112 on two sides of the gates, as shown in FIG. 2A. In the etching step, etching gas of $SF_6$, $CF_4$, $CHF_3$ or $C_2F_6$ is preferably used. Other anisotropic etching, such as plasma etching, is also applicable.

Conventional methods for forming gates are applicable, with the structure of the gates usually comprising silicon nitride layer 118, silicide 116, such as WSi, or polysilicon 114.

Next, using the gates and the spacers 112 as masks, ion implantation is performed to form source S and drain D in both the memory cell and peripheral regions. In the ion implantation step, preferable ions are P or As. Dosage is preferably $1 \times 10^{15} \sim 6 \times 10^{15}$ $cm^{-2}$, and preferable implantation energy is 1–40 keV.

Then, as shown in FIG. 2B, a barrier layer 120 is conformally formed to cover the gates in both the cell and peripheral regions. The barrier layer is preferably SiN or SiON. Next, photoresist material forms a mask layer 122 to cover the barrier layer at the cell region C. Etching is then performed to remove the barrier layer 120 in the peripheral region to expose source S and drain D.

After the removal of the mask layer 122, a metal layer 130 is conformally formed in the peripheral region (S), as shown in FIG. 2C. In this example, Titanium forms the metal layer. However, other metal, such as W, Co, and Ti are applicable as well. Thermal process, preferably at 700–750° C., is then carried out to induce the reaction of the silicon at the semiconductor substrate with the metal layer 130 to form silicide 126, 128 at the source and the drain. After the reaction, unreacted Ti can be selectively removed by chemical solution, such as ammonia solution or hydrogen peroxide.

During the thermal process, the reaction of metal layer 130 with the silicon nitride layer 118 or the spacers 112 is avoided by proper control of temperature. Since Titanium usually reacts with dielectric material above 900° C., when the temperature is controlled, as described earlier at 700~750° C., there will not be problems of unwanted reactions. Therefore, silicide only forms at the source and drain as required by the object of the invention.

Next, an interlayer dielectric (ILD) layer 124 is formed to entirely cover the memory cell region (C) and the peripheral region (S). The ILD layer is preferably dielectric material, such as silicon on glass (SOG), silicon oxide, BPSG etc. BPSG, having better gap-filling qualities, is adopted in this example. BPSG is deposited by atmospheric pressure chemical vapor deposition (APCVD), in an atmosphere of $SiH_4$, $PH_3$ and $B_2H_6$. Then, planarization may be optionally carried out to obtain a smooth surface.

According to the method for forming silicide at source and drain of the invention, easy integration with the current semiconductor process is obtained. Only an extra step of forming a mask layer by photolithography and etching is required. The existing barrier layer covers the area not requiring silicide, followed by thermal process to form silicide at the source and drain. Advantages of the present invention include no oxide filling problem, and effective reduction in sheet resistance and contact resistance. Quality of the semiconductor elements is thus enhanced to meet the requirements of high performance DRAMs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. A method for forming silicide at source and drain, comprising:

providing a semiconductor substrate having an active region and a peripheral region, wherein gates with source and drain on the sides are formed in the peripheral region;

conformally forming a single barrier layer to directly cover the active region and the peripheral region;

forming a mask layer to directly cover the single barrier layer at the active region;

removing the single barrier layer covering the peripheral region;

removing the mask layer;

forming a metal layer to cover the peripheral region; and subjecting the metal layer to thermal process so that silicon reacts with the metal to form silicide at the source and the drain.

2. The method as claimed in claim 1, wherein a plurality of gates having spacers on the sides are formed in the active region with source and drain in the semiconductor substrate on both sides of the gates.

3. The method as claimed in claim 1, wherein the barrier layer is a dielectric material layer.

4. The method as claimed in claim 3, wherein the dielectric material is SiN or SiON.

5. The method as claimed in claim 1, wherein the metal layer is a Co, W or Ti layer.

6. The method as claimed in claim 1, wherein the thermal process is a rapid thermal process.

7. The method as claimed in claim 6, wherein the rapid thermal process is performed at 700–750° C.

8. The method as claimed in claim 1, further comprising removing unreacted metal layer by chemical solution.

9. The method as claimed in claim 8, wherein the chemical solution is an ammonia solution or hydrogen peroxide.

10. The method as claimed in claim 1, wherein the mask layer is photoresist.

11. A method for forming silicide at source and drain, comprising:

providing a semiconductor substrate having an active region and a peripheral region, wherein gates with spacers on the sides are formed in the peripheral region, and source and drain are formed in the semiconductor substrate on both sides of the gates;

conformally forming a barrier layer to cover the active region and the peripheral region;

forming a mask layer to cover the barrier layer at the active region;

removing the barrier layer from the peripheral region;

removing the mask layer;

forming a metal layer to cover the peripheral region; and subjecting the metal layer to thermal process so that silicon reacts with the metal to form silicide at the source and the drain.

12. The method as claimed in claim 11, wherein the barrier layer is a dielectric material.

13. The method as claimed in claim 12, wherein the dielectric material is SiN or SiON.

14. The method as claimed in claim 11, wherein the metal layer is a Co, W or Ti layer.

15. The method as claimed in claim 11, wherein the thermal process is a rapid thermal process.

16. The method as claimed in claim 15, wherein the rapid thermal process is performed at 700–750° C.

17. The method as claimed in claim 11, further comprising removing unreacted metal layer by chemical solution.

18. The method as claimed in claim 17, wherein the chemical solution is an ammonia solution or hydrogen peroxide.

19. The method as claimed in claim 11, wherein the mask layer is photoresist.

20. A method for forming silicide at source and drain, comprising:

providing a semiconductor substrate having an active region and a peripheral region;

forming gates with spacers on the sides in the peripheral region, wherein the gate comprises a stack of a silicon nitride layer, a suicide layer and a polysilicon silicon layer;

forming source and drain regions in the semiconductor substrate on both sides of the gates;

conformally forming a single silicon nitride barrier layer to directly cover the active region and the peripheral region;

forming a photoresist mask layer directly to cover the single silicon nitride barrier layer at the active region;

removing the single silicon nitride barrier layer from the peripheral region;

removing the photoresist mask layer;

forming a metal layer to cover the peripheral region, wherein the metal layer is a Co, W or Ti layer;

subjecting the metal layer to rapid thermal process so that silicon reacts with the metal to form silicide at the source and the drain, wherein the rapid thermal process is performed at 700–750° C.; and removing unreacted metal layer by an ammonia solution or hydrogen peroxide solution.

* * * * *